United States Patent
Kitagawa et al.

(10) Patent No.: US 8,446,404 B2
(45) Date of Patent: May 21, 2013

(54) DISPLAY APPARATUS

(75) Inventors: Hideki Kitagawa, Osaka (JP); Hajime Imai, Osaka (JP); Atsuhito Murai, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 120 days.

(21) Appl. No.: 13/133,536

(22) PCT Filed: Aug. 12, 2009

(86) PCT No.: PCT/JP2009/064267
§ 371 (c)(1),
(2), (4) Date: Jun. 8, 2011

(87) PCT Pub. No.: WO2010/067645
PCT Pub. Date: Jun. 17, 2010

(65) Prior Publication Data
US 2011/0242086 A1     Oct. 6, 2011

(30) Foreign Application Priority Data

Dec. 10, 2008   (JP) .................................. 2008-314686

(51) Int. Cl.
*G06F 3/038*   (2006.01)
*G09G 5/00*    (2006.01)

(52) U.S. Cl.
USPC ......................................................... 345/212

(58) Field of Classification Search
None
See application file for complete search history.

(56) References Cited

U.S. PATENT DOCUMENTS

| | | | |
|---|---|---|---|
| 2004/0183763 A1* | 9/2004 | Matsui et al. | 345/87 |
| 2007/0164282 A1 | 7/2007 | Ishii | |
| 2007/0295966 A1* | 12/2007 | Watanabe et al. | 257/72 |
| 2010/0231562 A1* | 9/2010 | Brown | 345/207 |

FOREIGN PATENT DOCUMENTS

| | | |
|---|---|---|
| JP | 2007-192974 A | 8/2007 |
| WO | WO 2007/145347 A1 | 12/2007 |

* cited by examiner

*Primary Examiner* — Joseph Haley
*Assistant Examiner* — Nicholas Lee
(74) *Attorney, Agent, or Firm* — Birch, Stewart, Kolasch & Birch, LLP

(57) ABSTRACT

A display apparatus of the present invention includes display sections (100) and sensor circuit sections (200). A driver line RW for supplying power to a charge storage element (202) in the sensor circuit section (200) is provided so as to overlap, via an interlayer insulating film, a gate line G connected with a gate electrode (102) of a display-drive TFT element (101) in the display section (100). This makes it possible to realize a display apparatus having pixels in which optical sensors are provided which display apparatus makes it possible to suppress a decrease in aperture ratio which is caused by the provision of the sensor circuit sections, and reduce a parasitic capacitance between lines so as to increase a sensitivity of the optical sensors.

4 Claims, 7 Drawing Sheets

DISPLAY APPARATUS

TECHNICAL FIELD

The present invention relates to a display apparatus including a display panel in which optical sensors are provided in pixels.

BACKGROUND ART

A display apparatus has been heretofore proposed which has a display panel in which optical sensors are provided in pixels.

For example, as illustrated in FIG. 9, a display apparatus disclosed in Patent Literature 1 has display sections 1100 and sensor circuit sections 1200. Each of the display sections 1100 is made up of three subpixels corresponding respectively to red, green, and blue (RGB). Each of the sensor circuit sections 1200 is provided for a corresponding one of the display sections 1100.

In each of the display sections 1100, display-drive TFT elements 1101 are provided to the RGB subpixels, respectively. Each of the display-drive TFT elements 1101 is connected, via its electrodes, with a storage capacitor line CS, a gate line S, and a display source line S.

Each of the sensor circuit sections 1200 has a photoelectric element 1201, a NetA voltage-booster capacitor 1202, and an output AMP 1203.

In a case where the sensor circuit sections 1200 are thus provided to the display panel in addition to the display sections 1100, the number of lines is increased by the number of various lines of the sensor circuit sections 1200 thus added. Therefore, an aperture ratio is decreased as compared to a case where the sensor circuit sections 1200 are not provided.

Therefore, in the display apparatus illustrated in FIG. 9, corresponding display source lines S also serve as a voltage supply line 1231 for supplying a voltage to the output AMP 1203, and an output line 1232 for the output AMP 1203 to output a signal, respectively. Thus, the display apparatus suppresses a decrease in aperture ratio due to the addition of the sensor circuit sections 1200.

Citation List

Patent Literature 1
International Application Publication WO2007/145347 (Publication date: Dec. 21, 2007)

SUMMARY OF INVENTION

Technical Problem

Usually provided in the same wiring layer are the storage capacitor lines CS and the gate lines G in the display sections 1100, and the driver lines RW for the NetA voltage-booster capacitors 1202 and the reset lines RST for the photoelectric elements 1201 in the sensor circuit sections 1200. Therefore, there arises a problem in that an aperture ratio is decreased due to the driver lines RW and the reset lines RST which are added by the addition of the sensor circuit sections 1200. This leads to a deterioration of a display quality.

Furthermore, the driver lines RW and the reset lines RST overlap the display source lines S. This causes parasitic capacitances therebetween. This decreases a charging rate of the NetA voltage-booster capacitors 1202 which are electrically charged by the photoelectric elements 1201. This leads to a problem of a decrease in sensitivity of the optical sensors.

The present invention was made in view of the problems. An object of the present invention is to realize a display apparatus having pixels in which optical sensors are provided which display apparatus makes it possible to suppress a decrease in aperture ratio which is caused by the provision of the sensor circuit sections in the pixels, and reduce a parasitic capacitance between lines so as to increase a sensitivity of the optical sensors.

Solution to Problem

In order to attain the object, an display apparatus of the present invention is a display apparatus including: a display section; and a sensor circuit section, the display section including at least: a scanning signal line; a video signal line; a thin film transistor element for driving a pixel; a pixel electrode; and a storage capacitor line for maintaining an electric potential of each of the pixel electrodes, the sensor circuit section including at least: an photoelectric conversion element which outputs a signal having a signal level corresponding to an amount of received light; a thin film transistor element for a sensor; and a charge storage element, in the sensor circuit section, the charge storage element having two electrodes one of which is electrically connected with a gate electrode of the thin film transistor element for a sensor and the other of which two electrodes is electrically connected with a sensor-driving line for supplying a drive signal to the charge storage element, the video signal line in the display section orthogonally intersecting with the sensor-driving line in the sensor circuit section, the sensor-driving line in the sensor circuit section and the scanning signal line in the display section being provided in respective different wiring layers via an interlayer insulating film.

According to the arrangement, the sensor-driving line in the sensor circuit section and the scanning signal line in the display section, which orthogonally intersect with the video signal line in the display section, are provided in respective different wiring layers via the interlayer insulating film. It follows that the sensor-driving line and the scanning signal line are provided at a distance corresponding to a thickness of the interlayer insulating film. Accordingly, a distance between the video signal line in the display section and the sensor-driving line, and a distance between the video signal line and the scanning signal line are different at an intersection thereof. That is, a parasitic capacitance caused at the intersection between the video signal line and the sensor-driving line is different from a parasitic capacitance caused at the intersection between the video signal line and the scanning signal line.

This makes it possible to reduce as a whole a parasitic capacitance in each of the display sections, as compared to such an arrangement that the sensor-driving lines and the scanning signal lines are provided in the same layer. This makes it possible to reduce a load capacity of the sensor circuit sections. As a result, it becomes possible to increase a charting rate of the sensor circuit sections.

A charging rate thus increased in the sensor circuit sections makes it possible to reduce an area of the sensor circuit sections. This makes it possible to accordingly increase an aperture ratio in the display sections.

The display apparatus of the present invention is preferably arranged such that in a planar view of the display section, the sensor-driving line and the scanning signal line overlap each other.

An edge face of the sensor-driving line and that edge face of the scanning signal line may be aligned which is in an upper or lower direction.

In this case, an aperture ratio can be increased in proportion as an overlapping area between the sensor-driving line and the scanning signal line.

The display apparatus of the present invention is preferably arranged such that: the wiring layer in which the sensor-driving line is provided is referred to as a first wiring layer, and the wiring layer in which the scanning signal line is provided is referred to as a second wiring layer; an electrode is provided in the first wiring layer which electrode is connected with the sensor-driving line for the charge storage element in the sensor circuit section; and the storage capacitor line in the display section is provided in the second wiring layer.

According to the arrangement, provided in two layers are (i) the first wiring layer in which the electrode is provided which is connected with the sensor-driving line for the charge storage element, and (ii) the second wiring layer in which the storage capacitor line in the display section is provided. This makes it possible to form a capacitor therebetween. As a result, it becomes possible to reduce an area for a storage capacitor (Cs area). That is, this makes it possible to reduce an area for forming a capacitor in the display section and an area for forming a capacitor in the sensor circuit section.

This makes it possible to reduce a circuit size, without deterioration of a display characteristic of the display section and deterioration of a sensitivity of the optical sensors which are realized as the sensor circuits. This makes it possible to increase an aperture ratio.

The display apparatus of the present invention is preferably arranged such that at least any one of the electrode provided in the first wiring layer and the storage capacitor line provided in the second wiring layer is a transparent conductive film.

In this case, the electrode or the storage capacitor line is transparent. This makes it possible to further increase an aperture ratio.

The display apparatus is provided in various electronic apparatuses such as those with touch panels. Examples thereof are portable phones, digital cameras, PDAs (Personal Digital Assistant), mobile PCs (Personal Computer), portable game machines, in-car monitors (such as monitors of car navigation systems), notebook PCs, and monitors for PCs.

Advantageous Effects of Invention

As described above, the display apparatus of the present invention is a display apparatus including: a display section; and a sensor circuit section, the display section including at least: a scanning signal line; a video signal line; a thin film transistor element for driving a pixel; a pixel electrode; and a storage capacitor line for maintaining an electric potential of the pixel electrode, the sensor circuit section including at least: an photoelectric conversion element which outputs a signal having a signal level corresponding to an amount of received light; a thin film transistor element for a sensor; and a charge storage element, in the sensor circuit section, the charge storage element having two electrodes one of which is electrically connected with a gate electrode of the thin film transistor element for a sensor and the other of which two electrodes is electrically connected with a sensor-driving line for supplying a drive signal to the charge storage element, the video signal line in the display section orthogonally intersecting with the sensor-driving line in the sensor circuit section, the sensor-driving line in the sensor circuit section and the scanning signal line in the display section being provided in respective different wiring layers via an interlayer insulating film. This makes it possible to increase an aperture ratio in the display section.

DESCRIPTION OF EMBODIMENTS

The following describes one embodiment of the present invention. The present embodiment deals with an example in which a display apparatus of the present invention is applied to a liquid crystal display apparatus including an optical sensor touch panel (hereinafter, the liquid crystal display apparatus is referred to as an optical sensor TP system).

Figure 2:
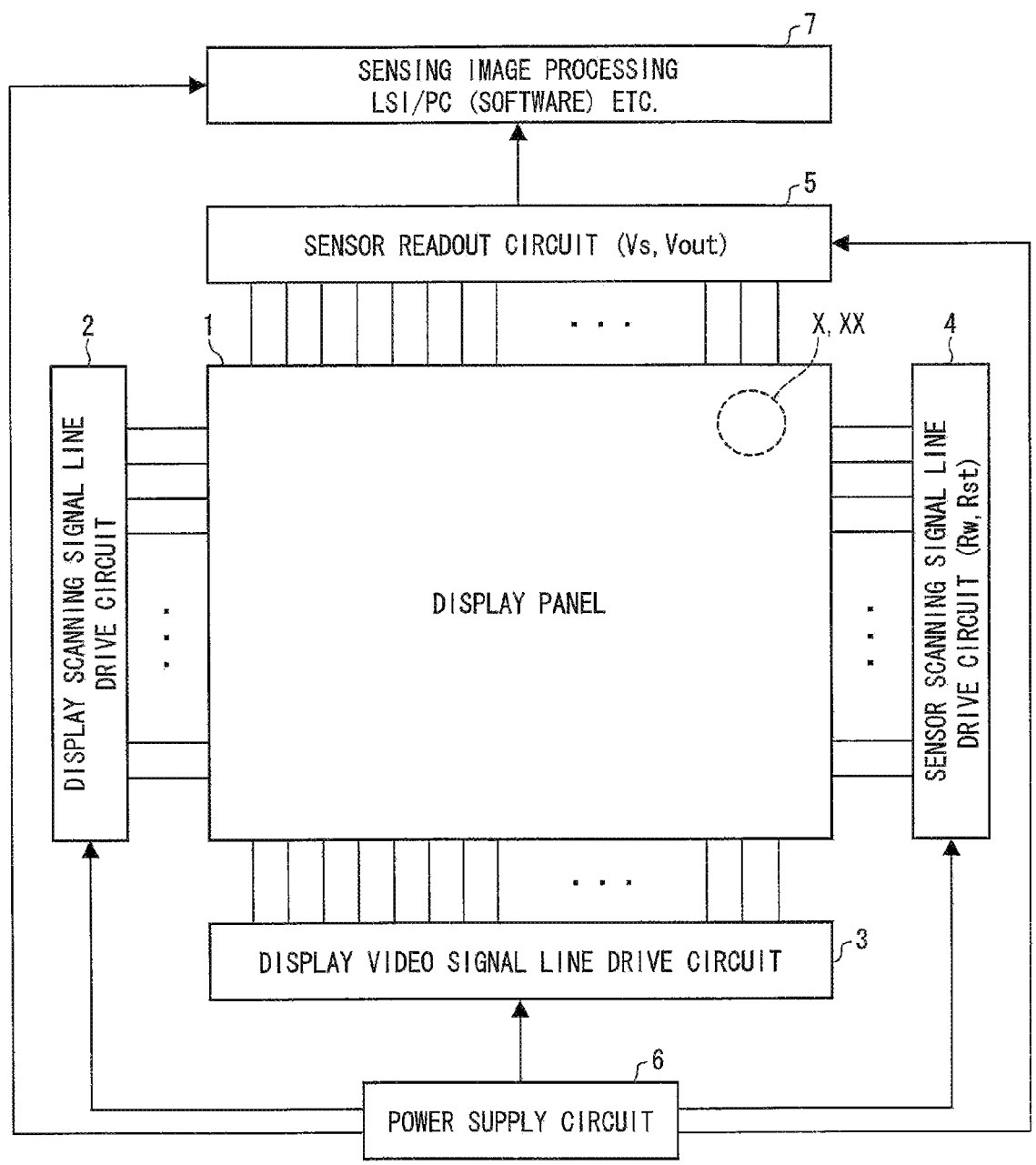
FIG. 2 is a block diagram illustrating an arrangement of a main part of the display apparatus including the display panel illustrated in FIG. 1.

As illustrated in FIG. 2, the optical sensor TP system of the present embodiment includes, around a display panel 1 which includes photoelectric conversion elements as optical sensors, a display scanning signal line drive circuit 2 and a display video signal line drive circuit 3, a sensor scanning signal line drive circuit 4 and a sensor readout circuit 5, a sensing image processing LSI 7 (personal computer with software) for finding coordinates of a touched position from sensing data supplied from the sensor readout circuit 5, and a power supply circuit 6.

The liquid crystal display apparatus illustrated in FIG. 2 is merely an example. Therefore, the present embodiment is not limited to the arrangement. Each of the sensor scanning signal line drive circuit 4 and the sensor readout circuit 5 may be functionally integrated into another circuit, specifically, the display scanning signal line drive circuit 2, the display video signal line drive circuit 3, or the like. A function of the sensor readout circuit 5 may be integrated into that of the sensing image processing LSI 7.

The following describes a detailed arrangement of the display panel 1.

Figure 1:
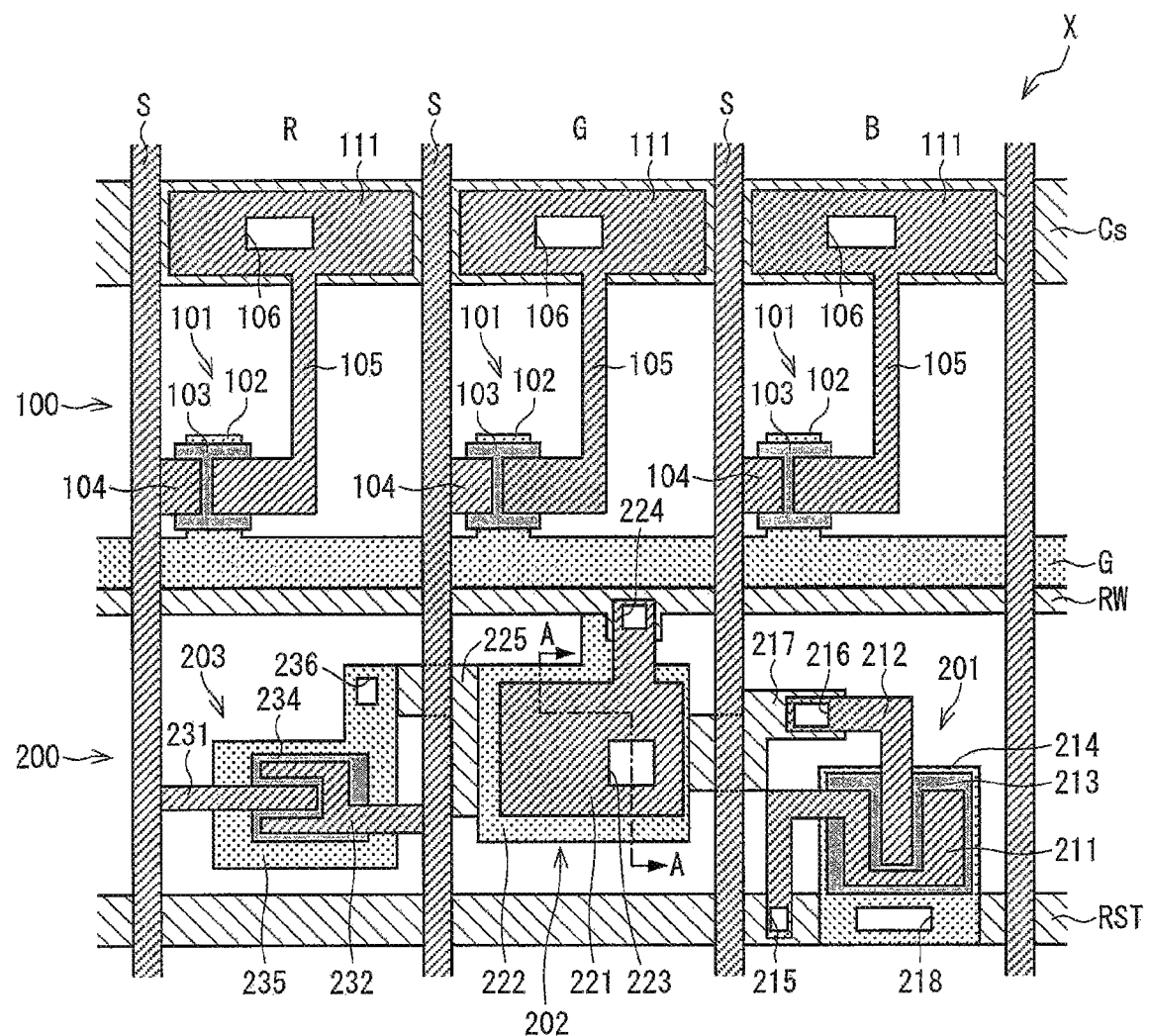
FIG. 1 is a plan view illustrating an arrangement of a main part of a display panel provided in a display apparatus of the present invention.
Figure 3:
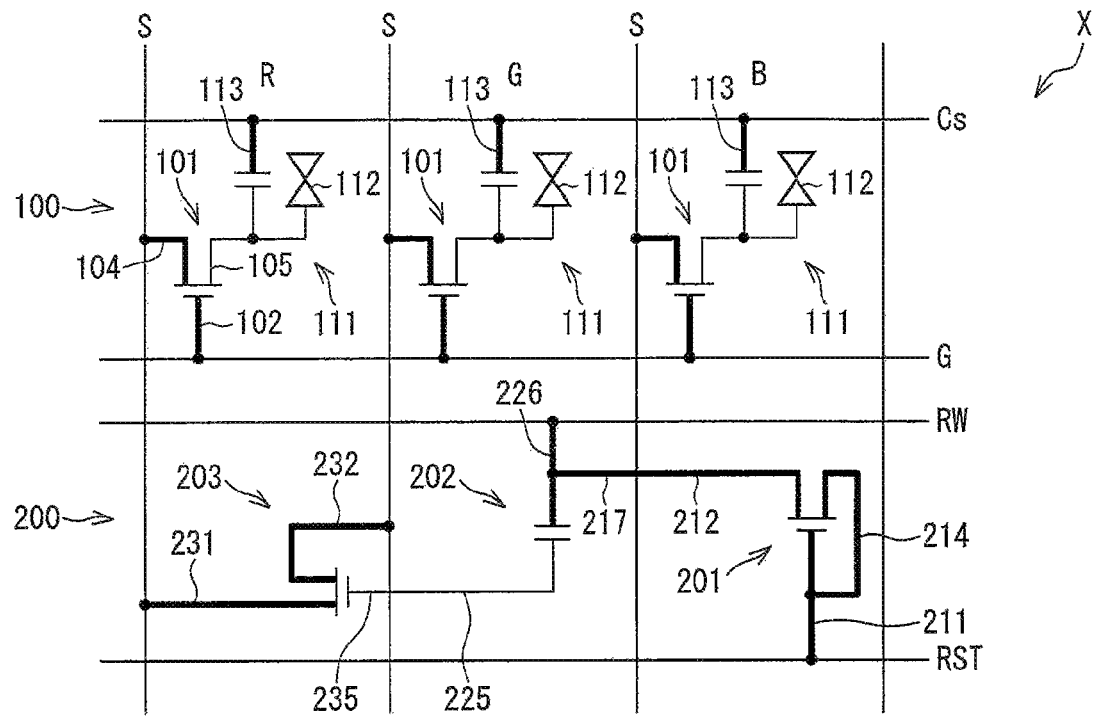
FIG. 3 is a circuit diagram illustrating an equivalent circuit of the display panel illustrated in FIG. 1.

FIG. 3 is a view illustrating an equivalent circuit of the display panel 1 illustrated in FIG. 1.

That is, as illustrated in FIG. 3, the display panel 1 includes the display sections 100 and the sensor circuit sections 200.

In each of the display sections 100, a corresponding one of the gate lines G which is a scanning signal line and corresponding source lines S which are video signal lines are provided so as to orthogonally intersect with each other. Provided in the vicinity of an intersection of the gate line G and one of the source lines S are: a corresponding one of the display-drive TFT elements 101 which serve as pixel-drive thin film transistor elements; a corresponding one of pixel electrodes 111; and a corresponding one of the storage capacitor lines CS for maintaining electric potentials of corresponding pixel electrodes 111.

Each of the display-drive TFT elements 101 has a gate electrode 102 connected with the gate line G, a source electrode 104 connected with a corresponding source line S, and a drain electrode 105 connected with a corresponding pixel electrode 111. The pixel electrode 111 is also connected with the storage capacitor line CS.

Each of the pixel electrodes 111 forms a liquid crystal capacitor 112 and a storage capacitor 113 between the pixel electrode 111 and an counter electrode of an opposed counter substrate (not illustrated).

On the other hand, each of the sensor circuit sections 200 is provided adjacently to a corresponding one of the display sections 100. Each of the sensor circuit sections 200 includes a corresponding one of the photoelectric conversion elements (photoelectric elements) 201 which output signals corresponding to amounts of received light, a corresponding one of charge storage elements 202, and a corresponding one of thin film transistor elements (thin film transistor elements for sensors) 203.

In each of the sensor circuit sections 200, a gate electrode 235 of the thin film transistor element 203 is connected with a drain electrode 212 of the photoelectric conversion element 201 via the charge storage element 202. A source electrode 231 of the thin film transistor element 203 is connected with a corresponding source line S which also serves as a voltage supply line. A drain electrode 232 of the thin film transistor element 203 is connected with a corresponding source line S which also serves as an optical sensor output line.

One electrode 217 of the charge storage element 202 is connected with the drain electrode 212 of the photoelectric conversion element 201. The other electrode 225 of the charge storage element 202 is connected with the gate electrode 235 of the thin film transistor element 203. Further, the one electrode 217 is connected with a line 226 which is electrically connected with a driver line (sensor-driving line) RW for supplying a drive signal to the charge storage element 202.

A gate electrode 211 of the photoelectric conversion element 201 is connected with a reset line RST, and also with a source electrode 214.

In the display panel 1, driver lines RW and the reset lines RST in the sensor circuit sections 200 are provided in the same wiring layer (first wiring layer). Similarly, the storage capacitor lines Cs and the gate lines G in the display sections 100 are provided in the same wiring layer (second wiring layer).

The first and second wiring layers are both insulating layers. The second wiring layer is stacked on the first wiring layer.

FIG. 1 is a plan view illustrating a wiring pattern of the equivalent circuit illustrated in FIG. 3.

In each of the display sections 100, as illustrated in FIG. 1, each of the gate electrodes 102 which constitute respective display-drive TFT elements 101 is connected with a corresponding source electrode 104 and with a corresponding drain electrode 105 via an interlayer insulating film 103. The drain electrode 105 is connected with a corresponding pixel electrode 111.

The pixel electrodes 111 are electrically connected with a corresponding storage capacitor line Cs via corresponding contact holes 106.

In each of the sensor circuit sections 200, the gate electrode 211 of the photoelectric conversion element 201 is electrically connected with a corresponding reset line RTS via a corresponding contact hole 215. The source electrode 214 which is connected with the gate electrode 211 via the interlayer insulating film 213 is electrically connected with the reset line RTS via a corresponding contact hole 218. Further, the drain electrode 212 is electrically connected with the electrode 217 via a corresponding contact hole 216.

A source electrode 221 of the charge storage element 202 is electrically connected, via a corresponding contact hole 223, with an electrode 222 which is provided in the second wiring layer where the gate lines G are provided. The source electrode 221 is also electrically connected with a corresponding driver line RW via a corresponding contact hole 224.

At least any one of the source electrode 221 and the storage capacitor line Cs may be a transparent conductive film. This makes it possible to further improve the aperture ratio.

Further, the source electrode 231 and the drain electrode 232 of the thin film transistor element 203 are connected with the gate electrode 235 via the interlayer insulating film 234. The gate electrode 235 is electrically connected with the electrode 225 of the charge storage element 202 via a corresponding contact hole 236.

According to the arrangement, in a planar view of the display section X, the gate line G in each of the display sections 100 overlaps the driver line RW in a corresponding sensor circuit section 200.

Figure 4:
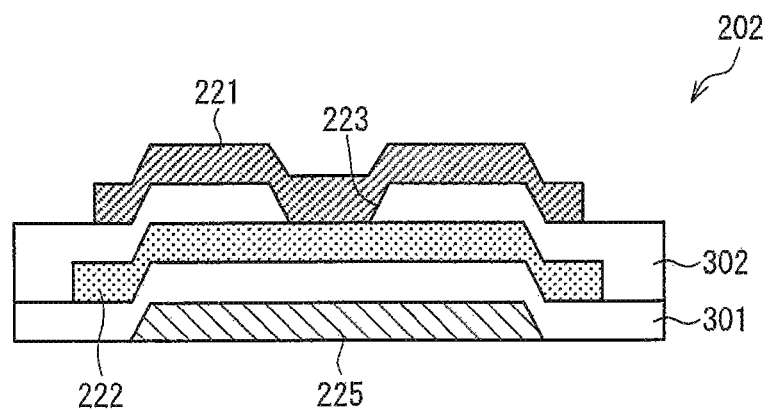
FIG. 4 is a fragmentary cross-sectional view taken along the A-A line in FIG. 1.

FIG. 4 is a fragmentary cross-sectional view taken along the A-A line in FIG. 1.

As illustrated in FIG. 4, in the second wiring layer where the gate lines G are provided, the electrode 222 is provided on the electrode 225 of the charge storage element 202 via a first interlayer insulating film (first wiring layer) 301. A second interlayer insulating film (second wiring layer) 302 is provided on the electrode 222. The second interlayer insulating film 302 has a contact hole 223 so that a part of the electrode 222 is exposed therethrough, and the source electrode 221 is electrically connected with the electrode 222 via the contact hole 223.

The arrangement illustrated in FIGS. 1 and 4 makes it possible to reduce a cross capacitance (parasitic capacitance). This increases a charging rate in the sensor circuit sections. As a result, a sensitivity of the optical sensors can be increased.

Alternatively, an aperture ratio can also be increased in such a manner that a two-layer structure is adopted as a structure of lines so that the sensor circuits are reduced in size with maintenance of their conventional sensitivity.

Figure 5:
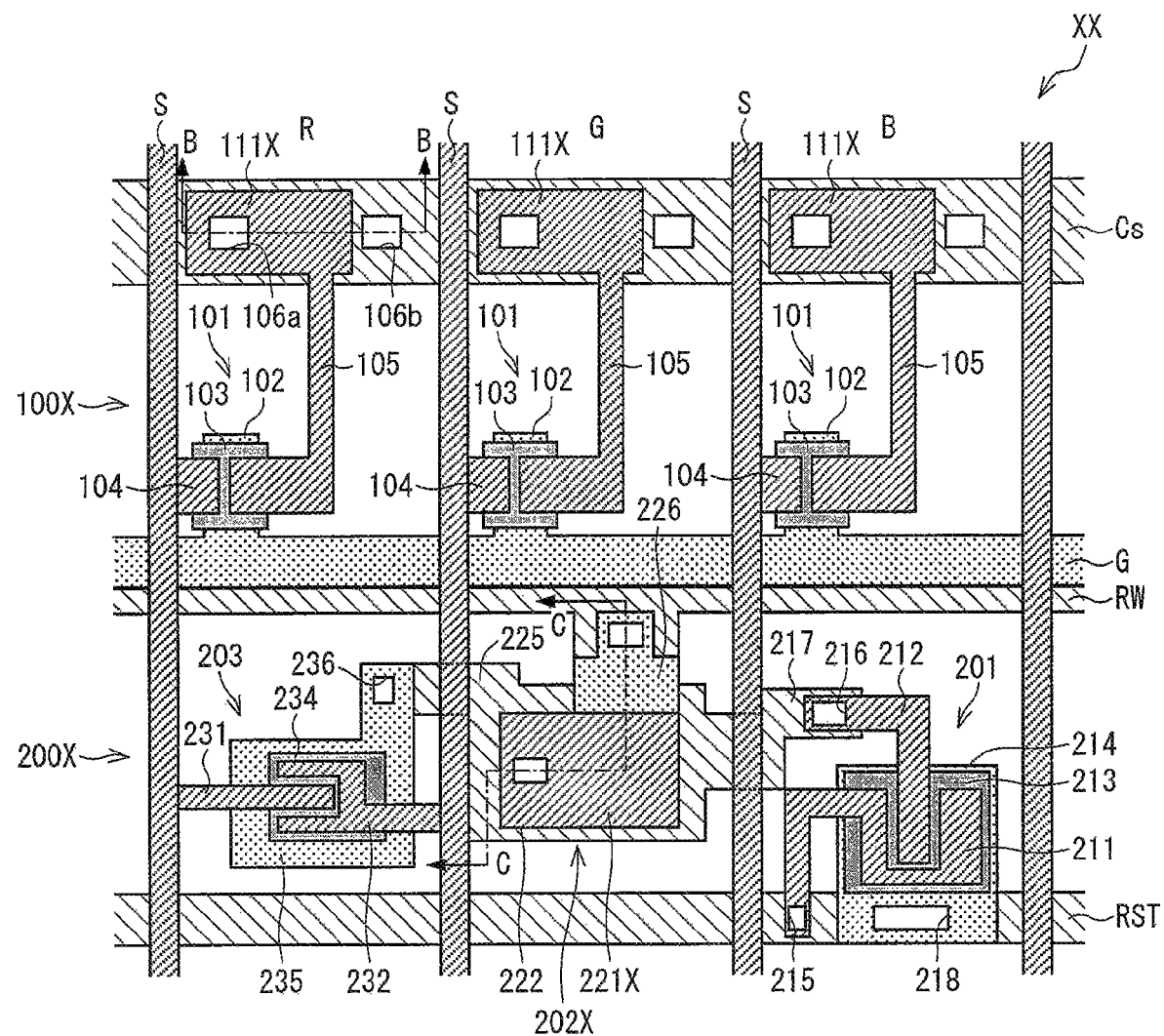
FIG. 5 is a plan view illustrating an arrangement of a main part of a display panel provided in another example of the display apparatus of the present invention.
Figure 6:
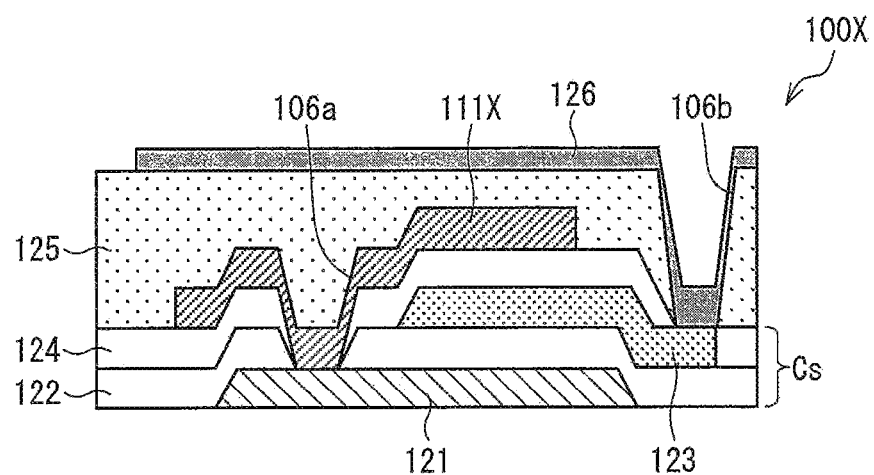
FIG. 6 is a fragmentary cross-sectional view taken along the B-B line in FIG. 5.
Figure 7:
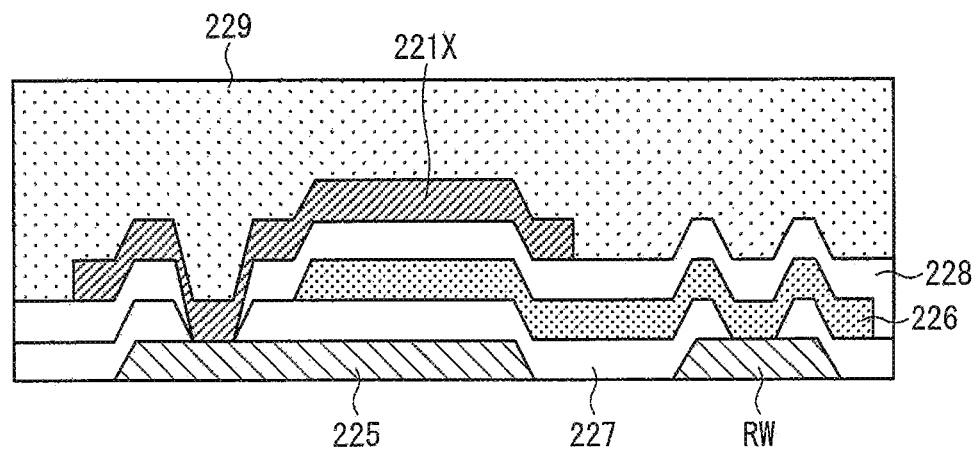
FIG. 7 is a fragmentary cross-sectional view taken along the C-C line in FIG. 5.

The following describes this, with reference to FIGS. 5 to 7.

FIG. 5 is a schematic plan view illustrating a display panel of another example of the display apparatus of the present invention.

FIG. 6 is a fragmentary cross-sectional view taken along the B-B line in the schematic plan view of FIG. 5.

FIG. 7 is a fragmentary cross-sectional view taken along the C-C line in the schematic plan view of FIG. 5.

The display panel illustrated in FIG. 5 basically has the same arrangement as that of the display panel illustrated in FIG. 1, except for a few differences. Therefore, members having the same functions are given common reference signs, and descriptions of such members are not repeated below.

The following deals with only differences therebetween.

The display panel illustrated in FIG. 5 includes: display sections 100X each of which has pixel electrodes 111X; and sensor circuit sections 200X each of which has a source electrode 221X. The pixel electrodes 111X are smaller in their surface area than the pixel electrodes 111 in FIG. 1. The source electrode 221X is smaller in its surface area than the source electrode 221 in FIG. 1.

As illustrated in FIG. 6, a storage capacitor line Cs includes a first gate line 121, a second gate line 123, and a first interlayer insulating film 122 via which the second gate line 123 is stacked on the first gate line 121. Each of the pixel electrodes 111X is electrically connected with the storage capacitor line Cs via a contact hole 106a. Provided between the second gate line 123 and the pixel electrode 111X is a second interlayer insulating film 124.

Further, an organic insulating film 125 is provided so as to cover the pixel electrode 111X. A pixel electrode 126 is provided on the organic insulating film 125. The pixel electrode 126 is electrically connected with the storage capacitor line Cs via a contact hole 106b.

Thus, the gate lines (i.e., the first gate line 121 and the second gate line 123) are stacked in two layers. This makes it possible to form a capacitor having a sandwich structure. This makes it possible to reduce an area of the pixel electrode 111X.

As illustrated in FIG. 7, further, an electrode 225 of a charge storage element 202X and a driver line RW are provided in a same layer. A line 226 is provided thereon via a first interlayer insulating film 227. The line 226 is electrically connected with the driver line RW. The source electrode 221X is provided on the line 226 via a second interlayer insulating film 228. The source electrode 221X is electrically connected with the electrode 225 via the contact hole 223.

The source electrode 221X is covered by an organic insulating film 229.

Thus, the gate lines (i.e., the electrode 225 and the line 226) are stacked in two layers. This makes it possible to form a capacitor having a sandwich structure. This makes it possible to reduce an area of the source electrode 221X.

As described above, the arrangements illustrated in FIGS. 6 and 7 make it possible to reduce the areas of the pixel electrode 111X and the source electrode 221X, respectively. As a result, an aperture ratio can be increased.

In the display apparatus thus arranged, the driver line RW in each of the sensor circuit sections 200 is provided in the first interlayer insulating film 301 which is an insulating layer, and each of the gate signal lines G in the display panel 1 is provided in the second interlayer insulating film 302 which is an insulating layer and is stacked on the first interlayer insulating film 301. This makes it possible to stack the gate signal lines G in the interlayer insulating film 302 on the driver lines RW provided in the first interlayer insulating film 301.

This makes it possible to suppress a decrease in aperture ratio of the display panel 1 which is caused by lines added by the provision of the sensor circuit sections 200.

Figure 8:
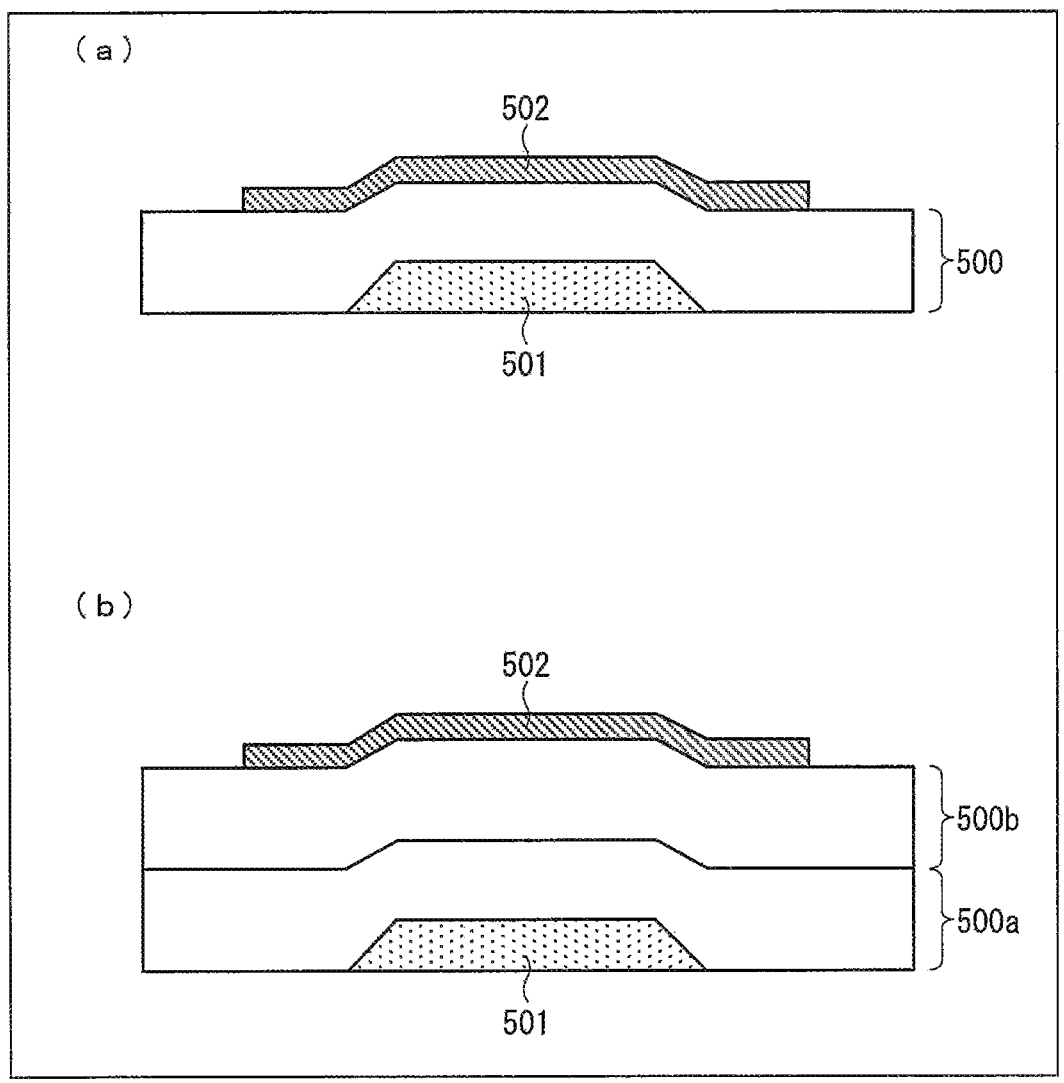
FIG. 8 is a view for illustration of an effect of reducing a parasitic capacitance between lines.
Figure 9:
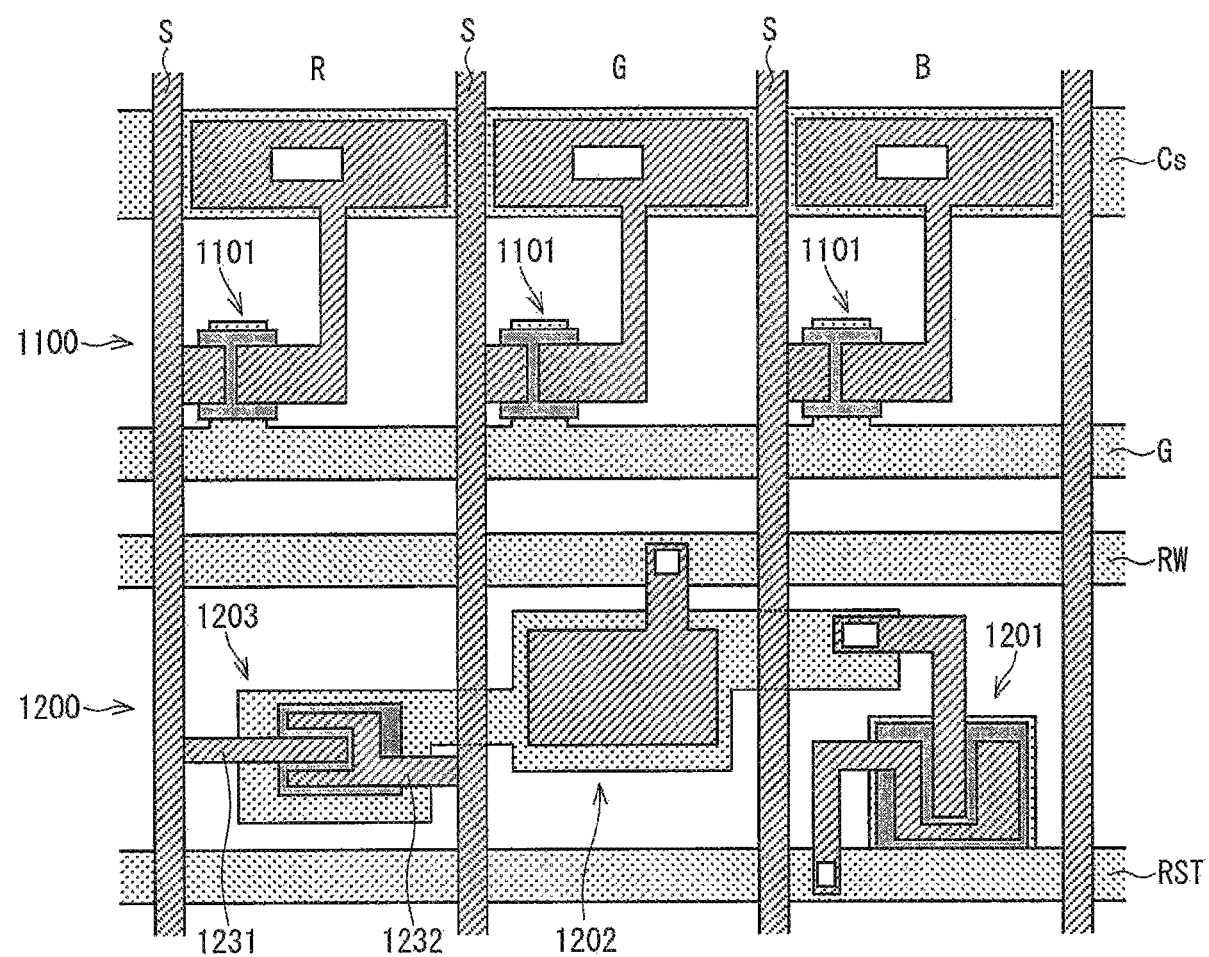
FIG. 9 is a plan view illustrating an arrangement of a main part of a common display panel.

As illustrated in (a) of FIG. 8 for example, a gate electrode line 501 provided in a gate wiring layer 500 is usually insulated from a source electrode line 502 provided on the gate wiring layer 500. However, a parasitic capacitance is generated therebetween.

In view of this, it is conceivable that as illustrated in (b) of FIG. 8 for example, the gate wiring layer 500 is divided into the two layers: gate wiring layers 500a and 500b, and a distance between the gate electrode line 501 and the source electrode line 502 is increased, in order that the generation of the parasitic capacitance is suppressed.

However, the display panel 1 usually has a small thickness in response to a recent trend. Therefore, the gate wiring layers cannot be very thick.

Further, in both arrangements illustrated in (a) and (b) of FIG. 8, the gate electrode line 501 is provided in the same layer. Therefore, as described above, the addition of the sensor circuit sections to the display section leads to a decrease in aperture ratio because of the added lines.

In view of this, according to the present invention, the wiring layer (second wiring layer) in which the gate electrode lines in the display sections are provided is stacked on the wiring layer (first wiring layer) in which the gate electrode lines in the sensor circuit sections are provided so that a decrease in aperture ratio due to the provision of the sensor circuit sections is suppressed, and a reduction of a parasitic capacitance between the lines increases a sensitivity of the optical sensors.

A parasitic capacitance is generated between a driver line RW in a sensor circuit section 200 and that source line S in the display panel 1 which overlaps the driver line RW and which also serves as an optical sensor output line for the sensor circuit section 200. Similarly, a parasitic capacitance is generated between a corresponding gate signal line G in the display panel 1 and the optical sensor output line for the sensor circuit section 200. This decreases a charging rate of the charge storage element 202 in the sensor circuit section 200.

In view of this, the driver line RW in the sensor circuit section 200 and the gate signal line G in the display panel 1 are stacked as described above. This makes it possible to reduce an overlapping area between (i) the source line S and (ii) the driver line RW and the gate signal line G. This makes it possible to suppress the generation of a parasitic capacitance. As a result, it becomes possible to increase a charging rate of the charge storage element in the sensor circuit section 200.

The display apparatus thus arranged makes it possible to suppress a decrease in aperture ratio of the display sections 100 which is caused by the provision of the sensor circuit sections 200. This makes it possible to improves a display quality. Furthermore, the display apparatus makes it possible to increase a charging rate of the charge storage elements in the sensor circuit sections. This makes it possible to increase a sensitivity of the optical sensors.

The display apparatus of the present invention is used in electronic apparatuses with touch panels, such as portable phones, in-car monitors (such as monitors of car navigation systems), monitors for PCs, other monitors, etc.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention is suitably applicable to all the electronic apparatuses with touch panels.

REFERENCE SIGNS LIST

1 Display panel
2 Display scanning signal line drive circuit
3 Display video signal line drive circuit
4 Sensor scanning signal line drive circuit
5 Sensor readout circuit
6 Power supply circuit
100 Display section
101 Display-drive TFT element
102 Gate electrode
103 Interlayer insulating film
104 Source electrode 105 Drain electrode
106 Contact hole
111 Pixel electrode
112 Liquid crystal capacitor
113 Storage capacitor
200 Sensor circuit section
201 Photoelectric conversion element
202 Charge storage element
203 Thin film transistor element
211 Gate electrode
212 Drain electrode
213 Interlayer insulating film
214 Source electrode
215 Contact hole
216 Contact hole
217 Electrode
218 Contact hole
221 Source electrode
222 Electrode
223 Contact hole
224 Contact hole
225 Electrode
226 Line
231 Source electrode
232 Drain electrode
234 Interlayer insulating film
235 Gate electrode
236 Contact hole
301 First interlayer insulating film
302 Second interlayer insulating film

The invention claimed is:

1. A display apparatus comprising:

a display section; and a sensor circuit section, the display section including at least: a scanning signal line; a video signal line; a thin film transistor element for driving a pixel; a pixel electrode; and a storage capacitor line for maintaining an electric potential of the pixel electrode, the sensor circuit section including at least: an photoelectric conversion element which outputs a signal having a signal level corresponding to an amount of received light; a thin film transistor element for a sensor; and a charge storage element, wherein in the sensor circuit section, the charge storage element having two electrodes one of which is electrically connected with a gate electrode of the thin film transistor element for a sensor and the other of which two electrodes is electrically connected with a sensor-driving line for supplying a drive signal to the charge storage element, the video signal line in the display section orthogonally intersecting with the sensor-driving line in the sensor circuit section, the sensor-driving line in the sensor circuit section and the scanning signal line in the display section being provided in respective different wiring layers via an interlayer insulating film, the wiring layer in which the sensor-driving line is provided is referred to as a first wiring layer, and the wiring layer in which the scanning signal line is provided is referred to as a second wiring layer;

an electrode is provided in the first wiring layer which electrode is connected with the sensor-driving line for the charge storage element in the sensor circuit section; and the storage capacitor line in the display section is provided in the second wiring layer.

2. The display apparatus as set forth in claim 1, wherein in a planar view of the display section, the sensor-driving line and the scanning signal line overlap each other.

3. The display apparatus as set forth in claim 1, wherein at least any one of the electrode provided in the first wiring layer and the storage capacitor line provided in the second wiring layer is a transparent conductive film.

4. An electronic apparatus comprising a display apparatus including;

a display section; and a sensor circuit section, the display section including at least: a scanning signal line; a video signal line; a thin film transistor element for driving a pixel; a pixel electrode; and a storage capacitor line for maintaining an electric potential of the pixel electrode, the sensor circuit section including at least: an photoelectric conversion element which outputs a signal having a signal level corresponding to an amount of received light; a thin film transistor element for a sensor; and a charge storage element, wherein in the sensor circuit section, the charge storage element having two electrodes one of which is electrically connected with a gate electrode of the thin film transistor element for a sensor and the other of which two electrodes is electrically connected with a sensor-driving line for supplying a drive signal to the charge storage element, the video signal line in the display section orthogonally intersecting with the sensor-driving line in the sensor circuit section, the sensor-driving line in the sensor circuit section and the scanning signal line in the display section being provided in respective different wiring layers via an interlayer insulating film, the wiring layer in which the sensor-driving line is provided is referred to as a first wiring layer, and the wiring layer in which the scanning signal line is provided is referred to as a second wiring layer;

an electrode is provided in the first wiring layer which electrode is connected with the sensor-driving line for the charge storage element in the sensor circuit section; and the storage capacitor line in the display section is provided in the second wiring layer.

* * * * *